_US008373364B2_

United States Patent
Santo et al.

(10) Patent No.: US 8,373,364 B2
(45) Date of Patent: Feb. 12, 2013

(54) SMART MONITORING OF LIGHT EMITTING DIODE STRINGS

(75) Inventors: Hendrik Santo, San Jose, CA (US);
Dilip Sangam, Saratoga, CA (US);
Timothy James Herklots, Cupertino, CA (US); Kien Vi, San Jose, CA (US);
Ronald William Young, Los Altos, CA (US); Matthew D. Schindler, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 447 days.

(21) Appl. No.: 12/648,610

(22) Filed: Dec. 29, 2009

(65) Prior Publication Data

US 2011/0156600 A1 Jun. 30, 2011

(51) Int. Cl.
*H05B 37/02* (2006.01)
(52) U.S. Cl. .................. 315/308; 315/294; 315/185 R
(58) Field of Classification Search ............. 315/185 R, 315/291, 294, 307, 308, 312
See application file for complete search history.

(56) References Cited

U.S. PATENT DOCUMENTS

| | | | | |
|---|---|---|---|---|
| 7,307,614 B2* | 12/2007 | Vinn | ............................. | 345/102 |
| 7,843,150 B2* | 11/2010 | Wang et al. | .................... | 315/307 |
| 8,169,156 B2* | 5/2012 | Hsu et al. | ...................... | 315/291 |

* cited by examiner

*Primary Examiner* — Don Le
(74) *Attorney, Agent, or Firm* — Fish & Richardson P.C.

(57) ABSTRACT

System(s) and method(s) are provide to efficiently assess performance of a set of light emitting diode (LED) strings in an illumination system. A multiplexer component collects input signal from the one or more LED strings via a first set of one or more monitoring pins, processes the collected input signal, and extracts at least one output signal. The at least one output signal is conveyed to a demultiplexer component through a second set of one or more monitoring pins, wherein the number of elements in the second set of monitoring pins is equal to or smaller than the number of monitoring pins in the first set. The collected input signal is processed in accordance with at least one mode of operation of the multiplexer component, the mode of operation autonomously configured by the demultiplexer component. The multiplexer component can autonomously generate intelligence on operating status of the set of LED strings.

18 Claims, 11 Drawing Sheets

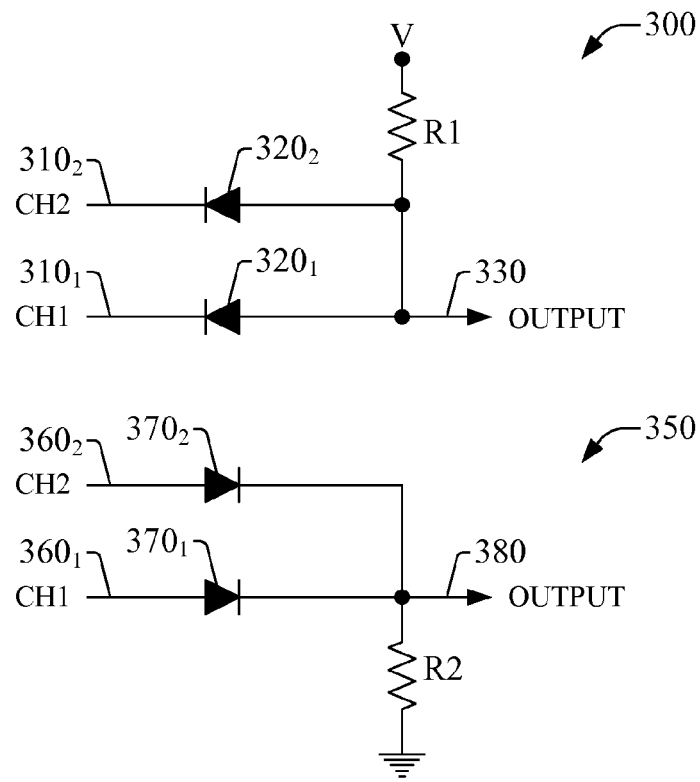
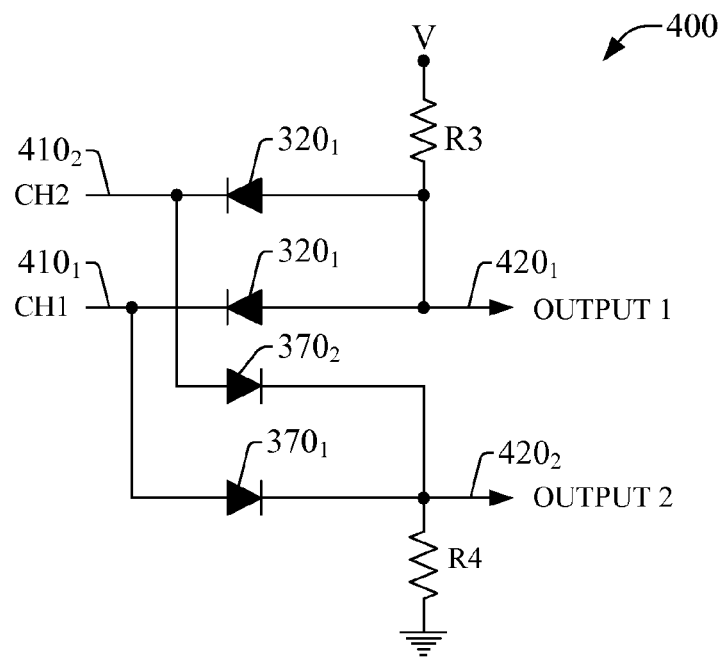
FIG. 3
FIG. 4

SMART MONITORING OF LIGHT EMITTING DIODE STRINGS

TECHNICAL FIELD

The subject disclosure relates to illumination systems that include light-emitting-diode (LED) technology and, more specifically, to efficient monitoring technique(s) to assess performance of one or more LED strings.

BACKGROUND

Backlights are used to illuminate liquid crystal displays ("LCDs"). LCDs with backlights are used in small displays for cell phones and personal digital assistants ("PDAs") as well as in large displays for computer monitors and televisions. Often, the light source for the backlight includes one or more cold cathode fluorescent lamps ("CCFLs"). The light source for the backlight can also be an incandescent light bulb, an electroluminescent panel ("ELP"), or one or more hot cathode fluorescent lamps ("HCFLs").

The display industry is enthusiastically pursuing the use of light emitting diodes (LEDs) as the light source in backlight display technology because CCFLs have many shortcomings: For instance, CCFLs do not easily ignite in cold temperatures, they require adequate idle time to ignite, and they require delicate handling. Moreover, LEDs generally have a higher ratio of light generated to power consumed than other backlight sources. Accordingly, displays with LED backlights can consume less power than other displays, which renders LED-based displays more sustainable. LED backlighting has traditionally been used in small, inexpensive LCD panels. However, LED backlighting is becoming more common in large displays such as those installed in computers and television sets. In large displays, multiple LEDs are required to provide adequate backlight for the LCD display.

As larger displays include LEDs, complexity of associated circuitry and LED configurations can substantially increase, rendering conventional monitoring techniques and architectures largely inadequate. Such inadequacy not only arises from increased signaling and processing required to monitor performance of larger installed LED configurations and related circuitry, but also from increased manufacturing difficulty and cost, as density of wiring required to operate and monitor operation of LEDs in a display increases. Accordingly, conventional approaches to monitoring performance of LEDs in complex display or illumination applications can be improved.

SUMMARY

The following presents a simplified summary of the subject disclosure in order to provide a basic understanding of some aspects thereof. This summary is not an extensive overview of the various embodiments of the subject disclosure. It is intended to neither identify key or critical elements nor delineate any scope. Its sole purpose is to present some concepts in a simplified form as a prelude to the more detailed description that is presented later.

One or more embodiments provide system(s) and method(s) to efficiently assess performance of a set of light emitting diode (LED) strings in an illumination system. A multiplexer component collects input signal(s) from the one or more LED strings via a first set of one or more monitoring pins, processes the collected input signal(s), and extracts at least one output signal. The at least one output signal is conveyed to a demultiplexer component through a second set of one or more monitoring pins, wherein the number of elements in the second set of monitoring pins is equal to or smaller than the number of monitoring pins in the first set. The collected input signal(s) is(are) processed in accordance with at least one mode of operation of the multiplexer component, the mode of operation is autonomously configured by the demultiplexer component.

In an aspect, autonomous configuration of the mode of operation of the multiplexer component can adjust monitoring of input signals based on timing restrictions or requirements of an illumination apparatus that utilizes the set of LED strings. The chosen mode of operation is just one of several modes of operation and can include a channel multiplexing mode that extracts a single value of the collected input signal, or a function processing mode that produces one or more values dictated by a predetermined function of the collected input signal(s). The multiplexer component can be embodied in at least one of discrete devices or an integrated circuit chipset, which can include one or more processors, whereas the demultiplexer component can be embodied in hardware or software or firmware application retained in memory and executed by one or more processors.

The multiplexer component can autonomously generate intelligence on operating status of the set of LED strings. Generation of operating status intelligence can be performed in response to configuration of an intelligence collection mode, and can be based at least in part on historical data of collected input signals. Generated operating status intelligence can be supplied to the demultiplexer component or other functional elements operatively coupled to the multiplexer component. In addition, the generated operating status intelligence can allow at the very least adjustment of performance criteria that determine normal or abnormal operation of the set of LED strings.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 3-4 illustrate example embodiments of an intelligent multiplexer based on discrete devices in accordance with features of the subject disclosure.

DETAILED DESCRIPTION

Figure 1:
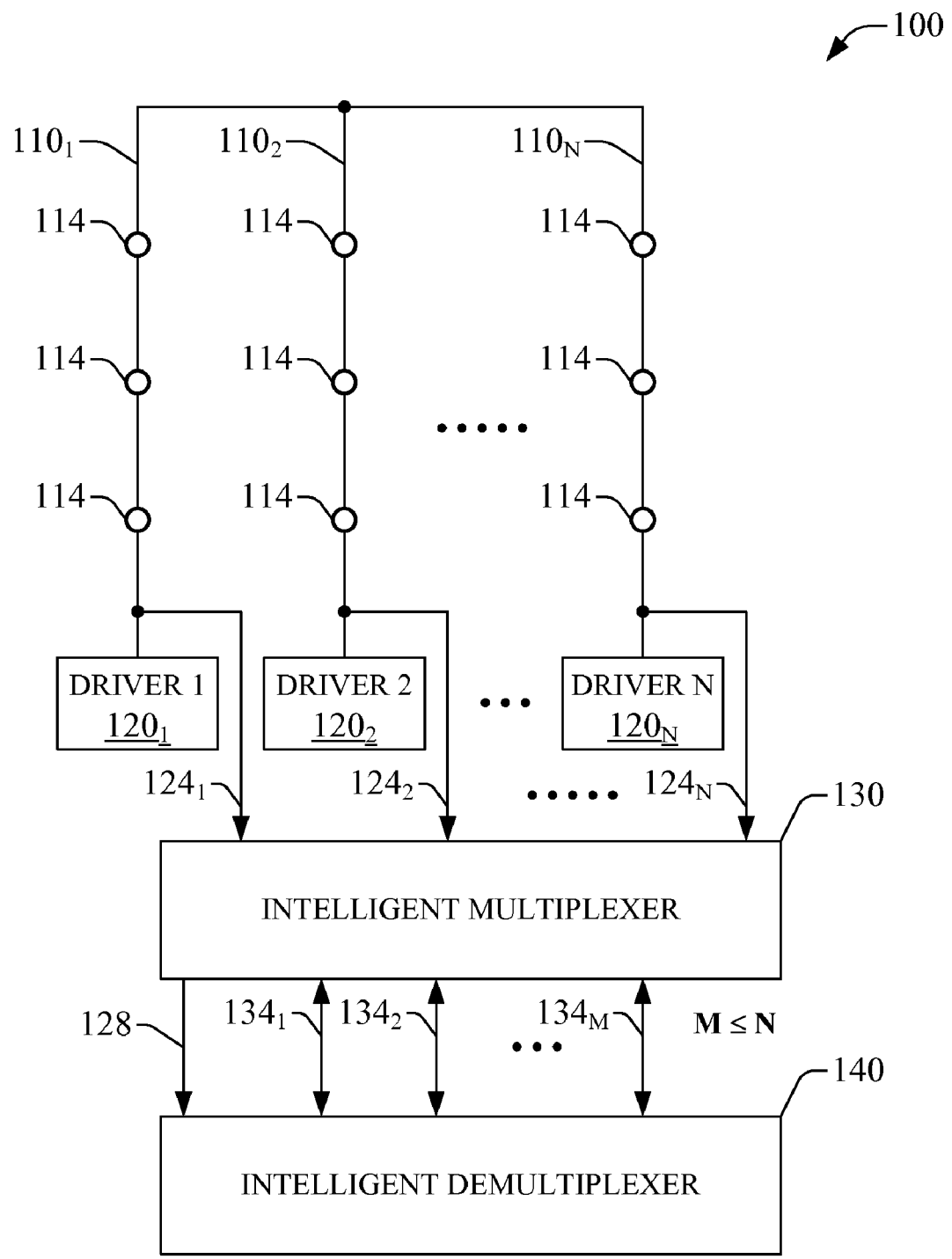
FIG. 1 is a block diagram of an example system that enables intelligent monitoring of a set of LED strings in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the present disclosure. It may be evident, however, that the various embodiments of the subject disclosure may be practiced without these specific details. In other instances, well-known structures and devices are shown in block diagram form in order to facilitate describing the present disclosure.

As employed in this specification and annexed drawings, the terms "component," "system," "interface," and the like are intended to include a computer-related entity or an entity related to an operational apparatus with one or more specific functionalities, wherein the entity can be either hardware, a combination of hardware and software, software, or software in execution. One or more of such entities are also referred to as "functional elements." As an example, a component may be, but is not limited to being a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, interface and the like.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of LED strings includes one or more LED strings; a set of devices includes one or more devices; etc.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 is a block diagram of an example system 100 that enables intelligent monitoring of a set of LED strings in accordance with aspects of the subject disclosure. The set of LED strings $110_1$-$110_N$ that can be part of an electronic display, e.g., within a backlight in a liquid crystal display, or other type of illumination applications such as LED-based street lighting; index N is an integer greater or equal than unity. Each string LED $110_\lambda$, with $\lambda=1, 2 \ldots N$, can include a group of one or more LEDs 114 which can be discretely scattered across an electronic display and connected in series by wires, traces or other connecting elements; as illustrated, each string $110_\lambda$ includes three LEDs. While LEDs 114 in string $110_\lambda$ are arranged in vertical fashion, other arrangements can be implemented, such as horizontal configuration. Moreover, illustrated LED strings $110_{1-N}$ are mutually parallel; however, other relative orientations are possible also. Each LED string $110_\lambda$ is controlled by a driver circuit $120_\lambda$, also referred to herein and annexed drawings as driver $120_\lambda$.

LED strings $110_1$-$110_N$ are functionally connected to an intelligent multiplexer 130 via respective monitoring pins $124_1$-$124_N$. Intelligent multiplexer component 130, also referred to herein and in annexed drawings as intelligent multiplexer 130, collects an input signal from one or more pins $124_1$-$124_N$ and generates output signal that is multiplexed and conveyed to an intelligent demultiplexer component 140, also referred to herein and in annexed drawings as intelligent demultiplexer 140, through a set of monitoring pins $134_1$-$134_M$, with index M being an integer greater than or equal to unity and smaller than or equal to N. In an aspect, intelligent multiplexer 130 can be a dedicated component embodied in a set of discrete devices, such as resistors, diodes, transistors, and combinations thereof, or as part of a dedicated integrated circuit with one or more processors, whereas intelligent demultiplexer 140 can be part of a core integrated circuit (IC) that operates the lightning system that includes LED strings $110_1$-$110_N$ and respective drivers $120_1$-$120_N$. Digital processing and related logic can implement, at least in part, functionality of intelligent multiplexer 130. Artificial intelligence (AI) methodologies also can implement, at least in part, functionality of intelligent multiplexer 130. Intelligent demultiplexer 140 can be implemented in hardware or as a software or firmware application retained in memory as a set of code instructions and executed by one or more processors. At least one of analog processing or digital processing can implement, at least in part, functionality of intelligent demultiplexer 140. Artificial intelligence (AI) methodologies also can implement, at least in part, functionality of intelligent demultiplexer 140.

In contrast to conventional lightning systems that exploit LEDs arranged in strings or other type of groupings, the combination of intelligent multiplexer 130 and intelligent demultiplexer 140 described in the subject disclosure can allow monitoring of operating status of LED strings $110_1$-$110_N$ with a reduced number of monitoring pins, e.g., M<N; in particular, scenario(s) in which M=1 can be implemented.

At least an advantage of the subject example system 100 is that through reduction of monitoring pins as compared with conventional systems, example system 100 can reduce physical size of the core IC that operates the lightning system that utilizes LED strings $110_1$-$110_N$ and respective drivers $120_1$-$120_N$ and thus reduce packaging complexity and costs. In particular, reduced number of monitoring pins, e.g., M<N, can reduce wire routing significantly in the core IC.

At least another advantage of reduce monitoring pins, e.g., M<N, is that as LED-based lightning systems increase in complexity, signaling to the core IC associated with monitoring operating status of LED strings $110_1$-$110_N$ can be maintained at a reduced level and thereby mitigating possible performance deterioration of the LED-based lightning system.

In addition, in example system 100 monitoring is decentralized and thus monitoring load and related signaling can be offloaded from a core IC that operates lightning system that exploits LED strings $110_1$-$110_N$ and related drivers $120_1$-$120_N$. Thus, even in scenario(s) in which M=N or M≅N, example system 100 can provide efficiencies with respect to conventional systems. In particular, in complex LED-based lightning systems, the decentralized architecture described herein can mitigate costly increases in complexity of the core IC that can arise from increased processing and signaling power necessary to centrally monitor performance of large, complex lightning systems that employ LED strings $110_1$-$110_N$ and associated drivers $120_1$-$120_N$. Moreover, when combined, decentralization and monitoring pin reduction can further enhance the foregoing advantages or efficiencies achieved through example system 100.

Various features or aspects of example system 100 and components therein are described in greater detail hereinafter.

Figure 2:
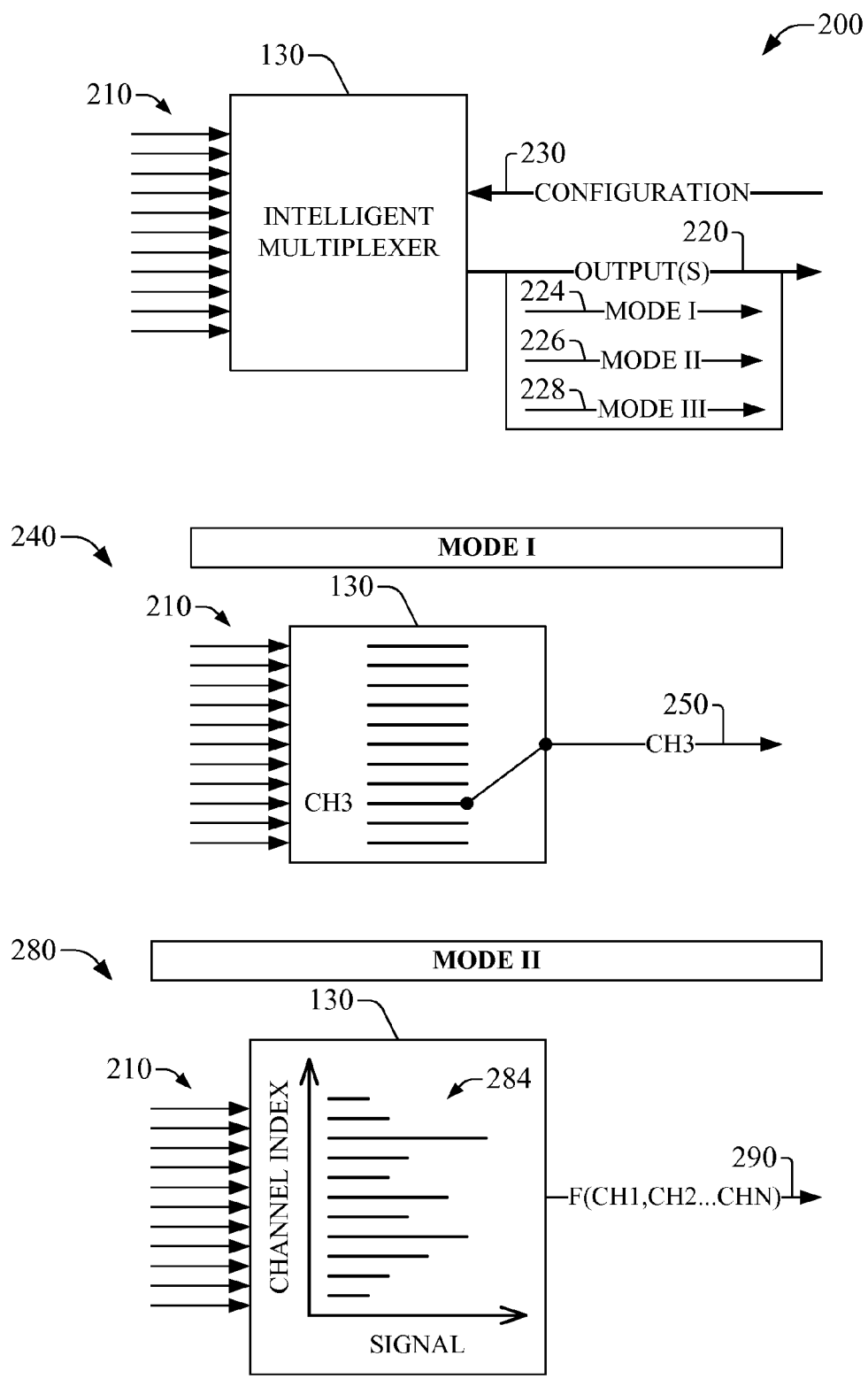
FIG. 2 illustrates diagrams of example mode of operation of an intelligent multiplexer in accordance with aspects described herein.

As illustrated in FIG. 2, intelligent multiplexer 130 can receive input signal(s) 210, illustrated in diagram 200, as an example, with N=11 input channels, and generate, e.g., extract and convey, one or more output(s) 220 in accordance with one or more modes of operation, which can be established by received configuration 230. Output(s) 220 can be conveyed through one or more monitoring pins (e.g., $134_1$-$134_M$). As an example, three modes are presented in diagram 200: Mode I 224, Mode II 226, and Mode III 228, which is a combination of the first and second mode. In an aspect, as illustrated in diagram 240, Mode I is a Channel Multiplexing mode (CMM) in which the intelligent multiplexer 130 extracts the value 250 of a specific single input channel, e.g., Channel 3 (CH3); such value can be conveyed through a single monitoring pin. Extraction of such single value can be performed by multiplexing the input signal(s) 210 in at least one of selective manner or sequential or series processing manner.

In another aspect, as illustrated in diagram 280, Mode II 226 is a Function Processing mode (FPM) that enables intelligent multiplexer 130 to extract a value 290 that is a function F=F(CH1, CH2 . . . CHN) of the signal values of channels CHλ, with λ=1, 2 . . . N, collected in input signal(s) 210; signal values for illustrative scenario with N=11 is depicted in panel 284. Thus, Mode II can be utilized to extract and supply a processing value of a set of two or more input channels simultaneously or substantially simultaneously in a parallel processing mode. In an example, a first function $F_1$ can be applied to a first set of input channels, e.g., CH1-CH4, and a second function $F_2$ can be applied to a second set of input channels, e.g., CH5-CH11. In Function Processing mode of operation, intelligent multiplexer 130 can supply continuous or nearly continuous monitoring of input signal, or activity, of a plurality of input channels relative to a predetermined or desired operating range or bounds: As an example, minimum value of all input signal can be determined and contrasted with a lower bound for short circuit voltage. As another example, maximum value of all input signal can be extracted, processed if necessary, and compared to a maximum reference value for electric dissipation or heating. Such continuous or nearly continuous monitoring afforded by FPM can enable time-dependent screening of performance of the set of LED strings $110_1$-$110_N$, and determination of abnormal operating status as gauged through predetermined reference or boundary values. Determination, or detection, of abnormal performance can lead to assessment of individual input channel condition to identify a faulty LED string as revealed by value of input signal.

The function F(•) can be any or most any function of input signal(s) 210: min(CH1, CH2 . . . CHN); max(CH1, CH2 . . . CHN); E(CH1, CH2 . . . CHN), wherein min(•) adopts the minimum value amongst a set of arguments, wherein max(•) adopts the maximum value amongst a set of two or more arguments, and E(•) produces a mean function such as arithmetic mean, geometric mean, and weighted versions thereof; etc. F(•) can be determined as part of configuration 230.

FIG. 3 illustrates example embodiments of intelligent multiplexer 130 based on discrete devices in accordance with features of the subject disclosure. It should be appreciated that while embodiments 300 and 350 of intelligent multiplexer 130 are based on diode logic, additional or alternative embodiments can be based on transistor logic or logic provided through other discrete devices. In example embodiment 300, diodes $320_1$ and $320_2$ can provide AND Boolean logic or a AND fuzzy logic. Two pins $310_1$ and $310_2$ for CH1 and CH2, respectively, provide input signal to respective diodes which produce a single output signal 330. In an aspect, forward bias voltage $V_F$ of diodes $320_1$ and $320_2$ satisfy $V_F \ll V_{CH\kappa}$, where $V_{CH\kappa}$ is the voltage value of CHκ and κ=1,2. The subject embodiment 300 supplies a single output signal 330 in CMM or FPM. In CMM, all unselected channels are pulled high via resistor R1 to multiplex a selected channel. In FPM, the supplied function is min(CH1,CH2). In particular, in FPM, output signal 330 is dictated by CH1 AND CH2 logic operation; or, in fuzzy logic, output signal 330 adopts the following values $V_{CH1}$ if $V_{CH1} < V_{CH2}$ or $V_{CH2}$ if $V_{CH2} < V_{CH1}$. In embodiment 300, the intelligent multiplexer defaults to FPM of operation if it does not operate in CMM.

With regard to embodiment 350, diodes $370_1$ and $370_2$ enable at least one of OR Boolean logic or OR fuzzy logic; in an aspect, forward bias voltage $V_F$ of diodes $370_1$ and $370_2$ satisfy $V_F \ll V_{CH\kappa}$. In addition, such diodes allow CMM and FPM. In CMM, all unselected channels are grounded via resistor R2 to multiplex a selected channel. In FPM, the supplied function is max(CH1,CH2). In particular, in FPM, output signal 380 is dictated by CH1 OR CH2 logic operation; or, in fuzzy logic, output signal 380 adopts the following values $V_{CH1}$ if $V_{CH1}>V_{CH2}$ or $V_{CH2}$ if $V_{CH2}>V_{CH1}$. Embodiment 350 has two input pins $360_1$ and $360_2$ and produces a single output signal 380. In embodiment 350, the intelligent multiplexer defaults to FPM of operation if it does not operate in CMM.

FIG. 4 is an example embodiment 400 of an intelligent multiplexer based on discrete devices in accordance with features of the subject disclosure. The subject example embodiment exploits logic afforded through the combination of AND and OR gates of embodiments 300 and 350, respectively. Intelligent multiplexer realized in circuit illustrated in embodiment 400 defaults to FPM of operation if it does not operate in CMM. Accordingly, two modes are enabled, CMM and FPM, with two output signals $420_1$ and $420_2$ which can be conveyed via two output pins (e.g., $134_1$ and $134_2$). In CMM, for output signal 1 $420_1$, all unselected channels are pulled high via resistor R3 to multiplex a selected channel. With respect to FPM, output signal 1 $420_1$ is min(CH1,CH2) which is accomplished as CH1 AND CH2 operation in Boolean logic. Likewise, in fuzzy logic realization, output signal 1 $420_1$ is $V_{CH1}$ if $V_{CH2}<V_{CH2}$, or $V_{CH2}$ if $V_{CH2}<V_{CH1}$. With respect to output signal 2 $420_2$, in CMM, all unselected channels are grounded via resistor R4 to multiplex a selected channel, whereas in FPM, output signal $420_2$ is dictated by Boolean OR operation CH1 OR CH2, or in accordance with fuzzy logic: $V_{CH1}$ if $V_{CH1}>V_{CH2}$ or $V_{CH2}$ if $V_{CH2}>V_{CH1}$.

In embodiment 400, a single output can be utilized to extract output signal in CMM even though output signal 1 $420_1$ or output signal 2 $420_2$ can provide a multiplexed output value of channel 1 (CH1) $410_1$ or channel 2 (CH2) $410_2$. Accordingly, in an aspect, an intelligent demultiplexer, e.g., 140, functionally coupled with the intelligent multiplexer of embodiment 400, can discard, e.g., blank or mask out, output signal that is not utilized to convey data in CMM. Determination of which output is read in CMM, or how output data is conveyed, can be based on at least one of design (e.g., efficiency) or policy associated with extraction of output signal: If pull high of unselected channel(s) is more efficient than grounding such channel(s), then output signal 1 $420_1$ can be utilized as read-out of multiplexed value and output signal 2 $420_2$ can be discarded or disabled for reading to avoid error in output reading at an intelligent demultiplexer operational coupled to embodiment 400.

The circuits of example embodiments 300, 350, and 400 can be realized in an integrated circuit (IC) and are non-limiting in that such embodiments represent only but a few of several logical gate circuits that can embody intelligent multiplexer 130.

Figure 5:
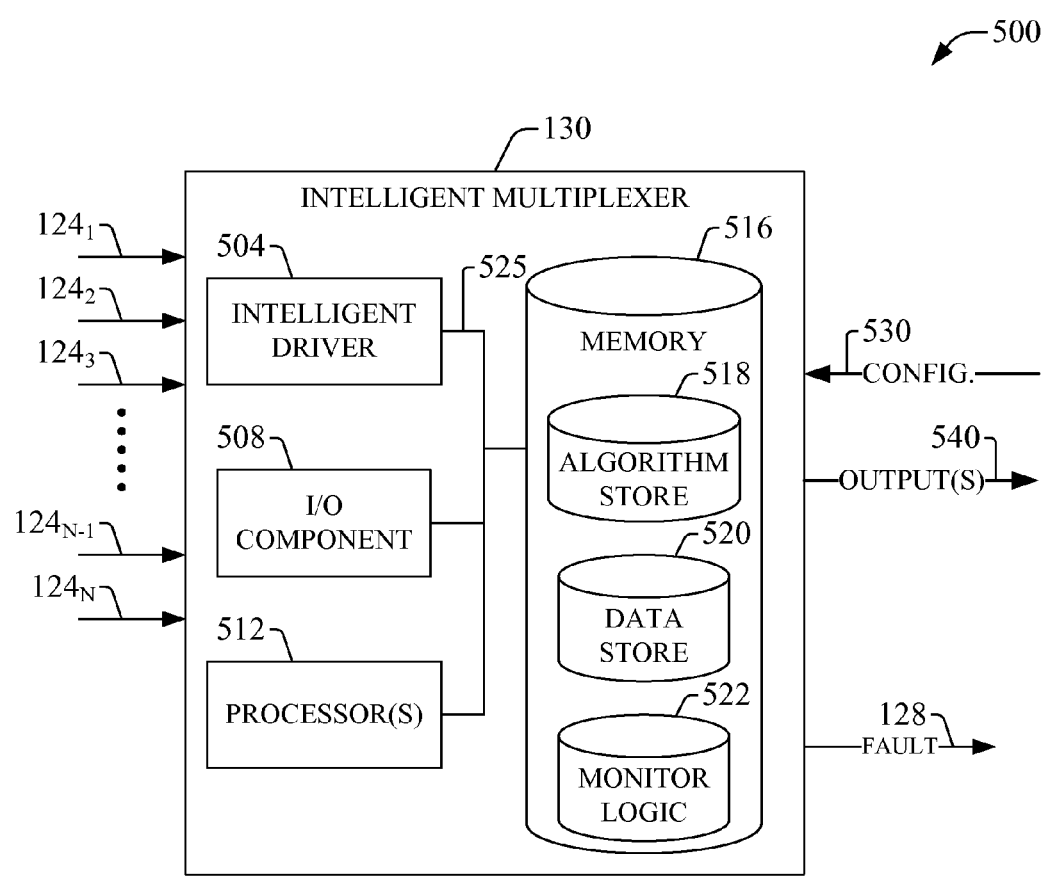
FIG. 5 is a block diagram of an example embodiment of intelligent multiplexer in accordance with aspects described herein.

FIG. 5 is a block diagram of an example embodiment 500 of intelligent multiplexer 130 in accordance with features of the subject disclosure. In an aspect, example embodiment 500 can be realized in a dedicated integrated circuit that is distinct from a core IC that can include intelligent demultiplexer 140. Intelligent driver component 504, also referred to herein and in annexed drawings as intelligent driver 504, can monitor input signal received via pins $124_1$-$124_N$. Monitor logic retained in memory element 522 can include one or more rules to be applied to received input signal(s); the one or more rules can dictate function(s), e.g., F(•) indicated supra, to be applied to input data and subsets thereof and associated results delivered in output(s) 540; specific input signal, or input channels, to be monitored and delivered as part of output(s) 540; or the like. Monitor logic retained in memory element 522 also can include operating ranges that define normal operating intervals for various performance metrics of LED strings $110_1$-$110_N$; intelligent driver 504 can compare input signal with predetermined operating ranges and establish if operating status of the set of LED strings $110_1$-$110_N$ is normal or abnormal; in an aspect, abnormal operating condition(s) can be reported in a dedicated output, monitoring pin 128, which can transport a single control bit to establish operating status.

In addition, intelligent driver 504 can generate intelligence on operation of a set of LED strings, e.g., $110_1$-$110_N$. Generation of intelligence can be based at least in part on historical input data, which can be retained in data store 520; generated intelligence can be retained in data store 520. In an aspect, generation of operation intelligence can include various operations on collected data such as generation of patterns (temporal or spatial) of operation of one or more LED strings, e.g., patterns of fault(s) in the set of LED strings can be identified and correlated with device information, e.g., device identity (ID), such as serial number, or external operation conditions (temperature, duty cycle, emitted photon wavelength, etc.) as part of root cause analysis for the fault pattern. Generated temporal patterns can provide operation trends which can unveil prospective fault(s).

In addition, generation of operation intelligence can allow autonomous configuration of ranges of normal operation (e.g., minimum voltage drop in a string, highest temperature in one or more strings . . . ) which can account for intrinsic performance deterioration of LED(s) in one or more strings and can ensure satisfactory operation without excessive, time-consuming monitoring such as performance of phased diagnosis (see, e.g., FIG. 7 and related description). Moreover, generation of operation intelligence can enable autonomous or automatic reconfiguration of function mode of the intelligent multiplexer to switch to diagnostic mode (e.g., phased sequence and multiplexed channel signal extraction) from Normal/Abnormal screening; in an aspect, such autonomous reconfiguration can based on cost-utility analysis that trades off cost of implementing diagnosis and thus not operating the set of strings in full (e.g., 100%) duty cycle, and benefit of identifying defective devices or functional elements and signaling maintenance. In another aspect, as part of intelligence generation, intelligent driver 504 can produce operating reports associated with the set of LED strings, e.g., $110_1$-$110_N$, based at least in part on predetermined monitoring logic, which can be retained in memory element 522.

In an aspect, intelligent driver 504 can exploit artificial intelligence (AI) methods to generate the operation intelligence described supra. Such intelligence can be generated through inference, e.g., reasoning and conclusion synthesis based upon a set of metrics, arguments, or known outcomes in controlled scenarios, or training sets of data. Artificial intelligence methods or techniques referred to herein typically apply advanced mathematical algorithms—e.g., decision trees, neural networks, regression analysis, principal component analysis (PCA) for feature and pattern extraction, cluster analysis, genetic algorithm, or reinforced learning—to a data set. In particular, intelligent driver 504 can employ one of numerous methodologies for learning from data and then drawing inferences from the models so constructed.

Such methodologies can be retained in algorithm store 518. As an example, Hidden Markov Models (HMMs) and related prototypical dependency models can be employed. General probabilistic graphical models, such as Dempster-Shafer networks and Bayesian networks like those created by structure search using a Bayesian model score or approximation can also be utilized. In addition, linear classifiers, such as support vector machines (SVMs), non-linear classifiers like methods referred to as "neural network" methodologies, fuzzy logic methodologies can also be employed. Moreover, game theoretic models (e.g., game trees, game matrices, pure and mixed strategies, utility algorithms, Nash equilibria, evolutionary game theory, etc.) and other approaches that perform data fusion, etc., can be exploited.

Configuration 530 can disclose a specific mode of generation and reporting of operational intelligence. As an example, configuration 530 can identify one or more groups of one or more inputs $124_1$-$124_N$ to be monitored and a specific function to be applied to at least one of the identified groups. As another example, configuration 530 also can determine a period for which historical data on input signal is to be reported, for example, to an intelligent demultiplexer. Such configuration can be supplied by intelligent demultiplexer 140 or one or more components therein.

In example embodiment 500, intelligent multiplexer 130 includes an input/output (I/O) component 508 that can enable download of available operational intelligence, which can be utilized for one or more of root cause analysis, LED string(s) design, recordation of historical operating status, or the like.

In embodiment 500, processor(s) 512 can be configured to provide or can provide, at least in part, the described functionality of intelligent multiplexer 130 or components therein. In an aspect, to provide such functionality, processor(s) 512 can exploit bus 525 to exchange data or any other information amongst components within intelligent multiplexer 130 and memory 516 or elements therein, such as or algorithm store 518, data store 520, or monitoring logic 522, also referred to herein and in annexed drawings as monitoring logic store 522. Bus 525 can be embodied in at least one of a memory bus, a system bus, an address bus, a message bus, or any other conduit, protocol, or mechanism for data or information exchange among components that execute a process or are part of execution of a process. The exchanged information can include at least one of code instructions, code structure(s), data structures, or the like.

Processor(s) 512 also can execute code instructions (not shown) stored in memory 516 to implement or provide at least part of the described functionality of intelligent multiplexer 130. Such code instructions can include program modules or software or firmware applications that implement specific tasks which can be accomplished through one or more of the methods described in the subject specification and that are associated, at least in part, with functionality or operation of example system 100. In one or more alternative or additional embodiment(s), processor(s) 512 can be distributed amongst one or more components of intelligent demultiplexer 140. Further, in some embodiments, at least one of intelligent driver component 504 or I/O component 508 can reside within memory 516 as one or more sets of code instructions that, when executed by processor(s) 512, implement such components and described functionality thereof.

At least one advantage of generation of operational intelligence through dedicated intelligent multiplexer 130 is that monitoring of operating status of the set of LEDs and feature extraction, or mining, can be offloaded from core IC, or processor(s) therein, that control operation of an illumination apparatus, e.g., electronic display, that exploits the set of LED strings $110_1$-$110_N$.

In one or more embodiments of the subject disclosure, intelligent demultiplexer component 140 can configure mode of operation, e.g., CMM or FPM, of intelligent multiplexer 130. In an aspect, such configuration also can include setting(s) of operating conditions of LED strings $110_1$-$110_N$ or respective drivers $120_1$-$120_N$ in a predetermined mode of operation; for example, intelligent demultiplexer 140 can trigger a predetermined sequence that powers on and off the various LED strings $120_1$-$120_N$ in accordance with a specific pattern. In another aspect, intelligent demultiplexer 140 can configure a current mode of operation in response to data received from a previous mode of operation; as described supra, CMM can be configured if output signal received at intelligent demultiplexer 140, as part of Function Processing mode of operation of intelligent demultiplexer 130, is out of range or specification for normal performance. In yet another aspect, based on design or implementation feature(s) of an embodiment of intelligent multiplexer 130, intelligent demultiplexer 140 can configure such multiplexer in an operation intelligence collection mode.

In addition, intelligent demultiplexer 140 can process received data, which can comprise output signal extracted by intelligent multiplexer 130. In an aspect, intelligent demultiplexer 140 can discard or mask readings of output signal that are not utilized in a particular monitoring operation or function (see, e.g., FIG. 4 and related description hereinafter). Data can be discarded logically, e.g., data is tagged and cached for a predetermined period, or physically, in which case the data is flushed when masked and any memory allocated to the data is emptied. Intelligent demultiplexer 140 can blank out at least a portion of data based on design of intelligent multiplexer 130 that conveys the output signal; such design and specification thereof can be conveyed, e.g., through standard programming techniques, to intelligent demultiplexer 140 at a time of provisioning the intelligent multiplexer 130 or at a subsequent instance.

Configuration component 604 in intelligent demultiplexer 140 illustrated in example embodiment 600 can implement the AI methods indicated supra to establish satisfactory time(s), e.g., optimal or nearly optimal time(s), at which to receive output signal(s) extracted by intelligent multiplexer 130. Such satisfactory time(s) can be synchronized with operation of an apparatus that exploits the set of LED strings $110_1$-$110_N$. In addition or in the alternative, satisfactory time(s) can accommodate output signal reception or extraction to adjust to timing requirements or availability of operation of the apparatus that utilizes LED strings $110_1$-$110_N$. For example, in high-duty cycle, configuration component 604 can determine a polling rate or schedule to extract output signal from one or more LED strings $110_1$-$110_N$ without substantive performance degradation of the apparatus.

In view of at least one of the configuration aspects or data processing aspects of intelligent demultiplexer 140, feature(s) of data generated at and received from intelligent multiplexer 130 is known at intelligent demultiplexer 140 at most any or any instant.

Figure 6A:
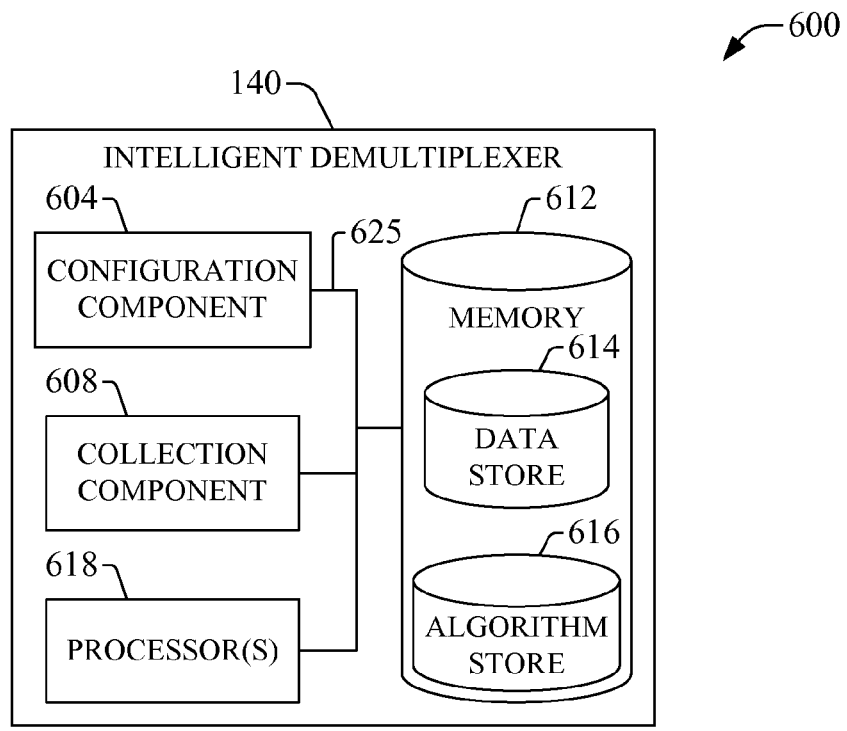
FIGS. 6A-6B illustrate example embodiments of intelligent demultiplexer in accordance with aspects disclosed herein.
Figure 6B:
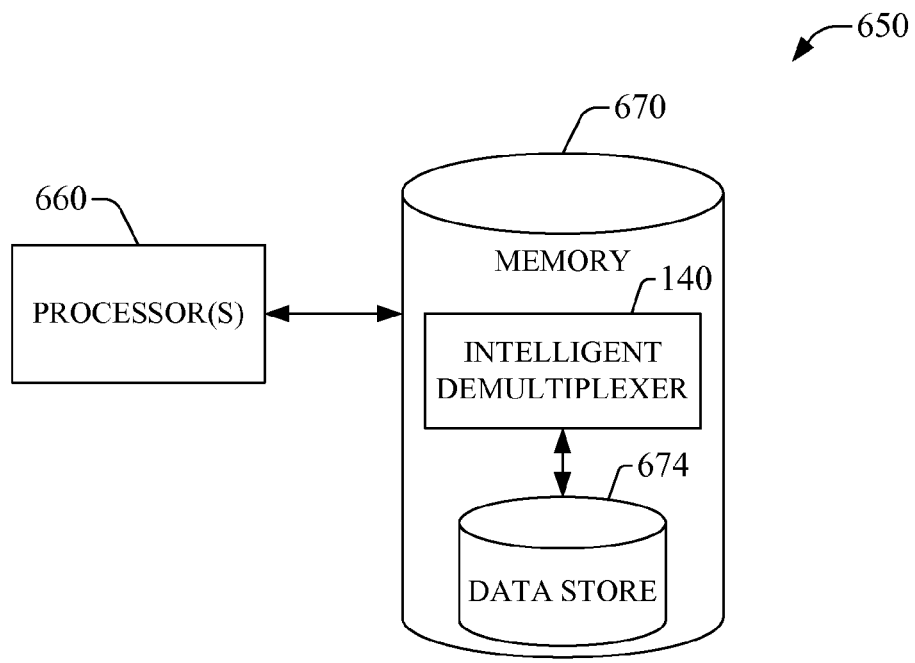

FIGS. 6A-6B illustrate example embodiments of intelligent demultiplexer 140 in accordance with aspects described herein. In example embodiment 600, configuration component 604 can convey an indication to monitor data in accordance with a specific mode of operation, such as one of CMM, FPM, or a combination thereof. In addition, configuration component 604 can exploit monitoring criteria (not shown) retained, e.g., in algorithm store 616, to establish if a current mode of operation of intelligent multiplexer 130 is to be altered. Collection component 608 can receive data through a set of monitoring pins (e.g., $134_1$-$134_M$; not shown in FIG. 6A) in accordance with the specific mode of operation. Collection component 608 also can discard or mask received data as described supra. At least a portion of received data can be retained in memory element 614 within memory 612.

In example embodiment 600, processor(s) 618 can be configured to provide or can provide, at least in part, the described functionality of intelligent demultiplexer 140 or components therein. In an aspect, to provide such functionality, processor(s) 618 can exploit bus 625 to exchange data or any other information amongst components within intelligent demultiplexer 140 and memory 612 or elements therein such as data store 614 or algorithm store 616. Bus 625 can be embodied in at least one of a memory bus, a system bus, an address bus, a message bus, or any other conduit, protocol, or mechanism for data or information exchange among components that execute a process or are part of execution of a process. The exchanged information can include at least one of code instructions, code structure(s), data structures, or the like. Processor(s) 618 also can execute code instructions (not shown) stored in memory 612 to implement or provide at least part of the described functionality of intelligent demultiplexer 140. Such code instructions can include program modules or software or firmware applications that implement specific tasks which can be accomplished through one or more of the methods described in the subject specification and that are associated, at least in part, with functionality or operation of example system 100. In one or more alternative or additional embodiment(s), processor(s) 618 can be distributed amongst one or more components of intelligent demultiplexer 140.

In embodiment 650, intelligent demultiplexer component 140 can be implemented as software or firmware and reside within a memory 670 as one or more sets of code instructions that, when executed by processor(s) 660, implement intelligent demultiplexer component 140, or component(s) therein, and described functionality thereof. Data received as part of execution of intelligent demultiplexer 140 can be retained in data store 674. In addition, data store 674 can include algorithm(s) described supra and retained in algorithm store 616.

Figure 7A:
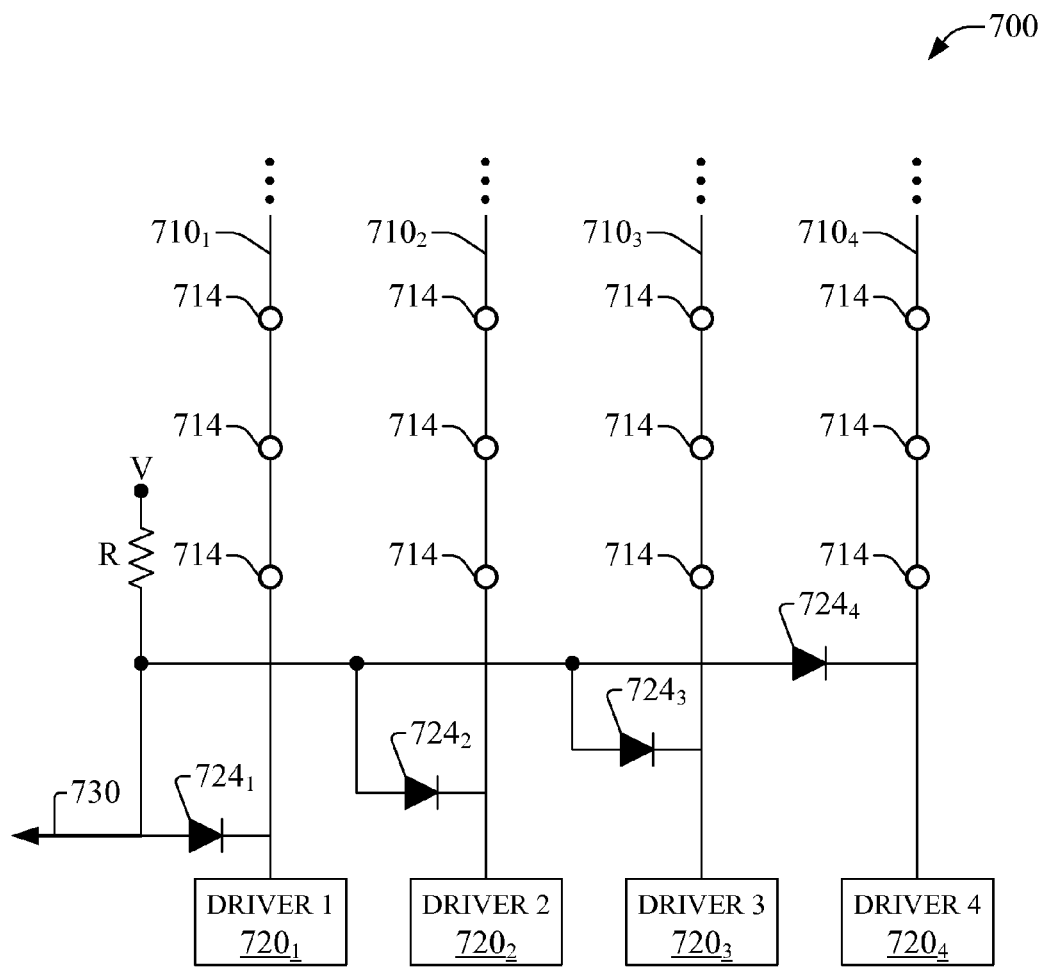
FIGS. 7A-7B illustrate, respectively, a diagram of an example system that enables monitoring of operating status of a group of LED strings through a single output pin, and a sketch of a power sequence for the example system in accordance with aspects described herein.
Figure 7B:
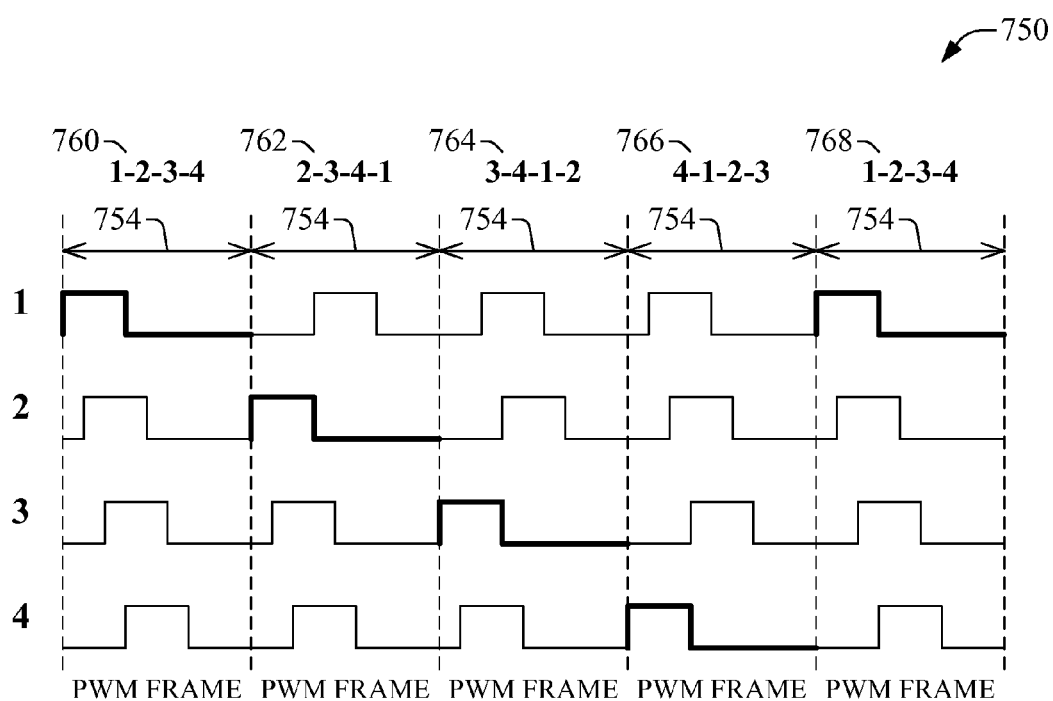

FIG. 7A illustrates a diagram of an example system 700 with four LED strings and an intelligent multiplexer embodied in a set of discrete devices that enables monitoring of operating status of the four LED strings through a single output pin. Monitoring is also allowed by application of a predetermined power phasing sequence. In example system 700, string voltage can be monitored to detect, for example, over-dissipation in one or more LED strings $710_1$-$710_4$; over-dissipation can be caused by one or more shorted LEDs, e.g., one of LEDs 714, in one or more LED strings, or simply by over-mismatched string on the same display in which the LED strings operate.

In an aspect, the intelligent multiplexer is embodied in four diodes (e.g., Schottky diodes, regular diodes, or a combination thereof) $724_1$-$724_4$ connected to respective LED strings $710_1$-$710_4$. Diodes $724_1$-$724_4$ are connected to a pull-high resistor R, and enable protection of drivers $720_1$-$720_4$ from over-voltage. In the illustrated embodiment, diodes $724_1$-$724_4$ extract the lowest voltage amongst LED strings $710_1$-$710_4$ and output such voltage through a single output signal pin 730; it should be appreciated that in the subject embodiment of intelligent multiplexer, the set of four diodes $724_1$-$724_4$ effectively operate as a Boolean OR gate or fuzzy logic OR gate. Accordingly, to monitor and extract voltage of a single LED string $710_\gamma$ (with $\gamma=1, 2, 3, 4$), or associated driver $720_\gamma$, single-driver operation (e.g., one driver on and remainder drivers off) at measurement time or substantially at measurement time is to be ensured. Powered off LED strings in such operation pull high. To produce single-driver operation, phased power-on of drivers $720_1$-$720_4$ can be implemented such that phasing results in staggered time-dependent power for each driver. Diagram 750 in FIG. 7B exemplifies such phasing: At each pulse-width-modulation (PWM) frame, power-on signal is relatively phase-shifted for each of strings $710_1$-$710_4$ (indicated with bold indices 1 through 4 in FIG. 7) and string voltage is collected, via output pin 730, for the LED string that is first powered on, indicated in each PWM frame 754 with a thick line and a sequence order label, e.g., 760 through 768. Such staggered phasing can be most efficiently implemented in system(s) wherein power sources for drivers $720_1$-$720_4$ with the same PWM settings, which ensures a predetermined phase shift magnitude is preserved throughout a plurality of frames.

Phase-shifted power sequence(s) similar to or modified from that illustrated in diagram 750 can be exploited for high-duty or full-duty cycle systems that include more than four LED strings. Since in such systems monitoring timing can introduce performance issues, an intelligent multiplexer can be configured for operation in FPM mode to detect performance of various or all LED strings simultaneously and determine if performance of the system is normal or abnormal; such screening can be performed continuously or nearly continuously. If such screening reveals normal operation, screening can continue. But if screening reveals abnormal operation, such as operation in LED short or open range, a diagnosis sequence can be effected to identify a LED string that operates abnormally. The diagnosis sequence can include a phase-shifted power on sequence in which a single LED string in the system is powered on at a time and voltage for such single LED string is extracted. In such monitoring mode, intelligence multiplexer described herein allows the system 700 to maintain full-duty or high-duty cycle operation uninterrupted until faulty operation is detected.

In an aspect, in full-duty or high-duty cycle systems, the phase-shifted sequence(s) that can be employed for the foregoing diagnosis or root cause analysis can include pulse-off of $110_1$-$110_N$ LED strings in a set of N LED strings for a time interval (e.g., 10 μs) that allows measurement of operation voltage of the single, powered on LED string. To at least that end, a counter that measures input PWM period in power source for the set of N LED strings can be employed to pulse-off the $110_1$-$110_N$ LED strings. Thus, diagnosis of an abnormal condition, e.g., overheating, in an LED string can be detected within the time scale in which the counter overflows, for example, about 30 ms, if the N LED strings are cycled with a period equal or nearly equal to the overflow period for the counter. Diagnosis of overheating in a full-duty or high-duty cycle system of N LED strings, e.g., $110_1$-$110_N$, can be performed in about N×30 ms, or in less than 1 s for typical systems. In the alternative or in addition, pulse off and diagnosis can be performed at the beginning of the counter rather than at overflow.

In view of the example system(s) described above, example method(s) that can be implemented in accordance with the disclosed subject matter can be better appreciated with reference to flowcharts in FIGS. 8-12. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, one or more example methods disclosed herein can alternatively be represented as a series of interrelated states or events, such as in a state diagram. Moreover, interaction diagram(s) may represent methods in accordance with the disclosed subject matter when disparate entities enact disparate portions of the methodologies. Furthermore, not all illustrated acts may be required to implement a described example method in accordance with the subject specification. Further yet, two or more of the disclosed example methods can be implemented in combination with each other, to accomplish one or more features or advantages described herein.

Methods disclosed throughout the subject specification and annexed drawings are capable of being stored on an article of manufacture to facilitate transporting and transferring such methodologies to computers for execution, and thus implementation, by a processor or for storage in a memory. In an aspect, one or more processors that enact method(s) described herein can be employed to execute code instructions retained in a memory, or any computer- or machine-readable medium, to implement method(s) described herein; the code instructions, when executed by the one or more processor implement or carry out the various acts in the method(s) described herein. The code instructions provide a computer- or machine-executable framework to enact the method(s) described herein.

Figure 8:
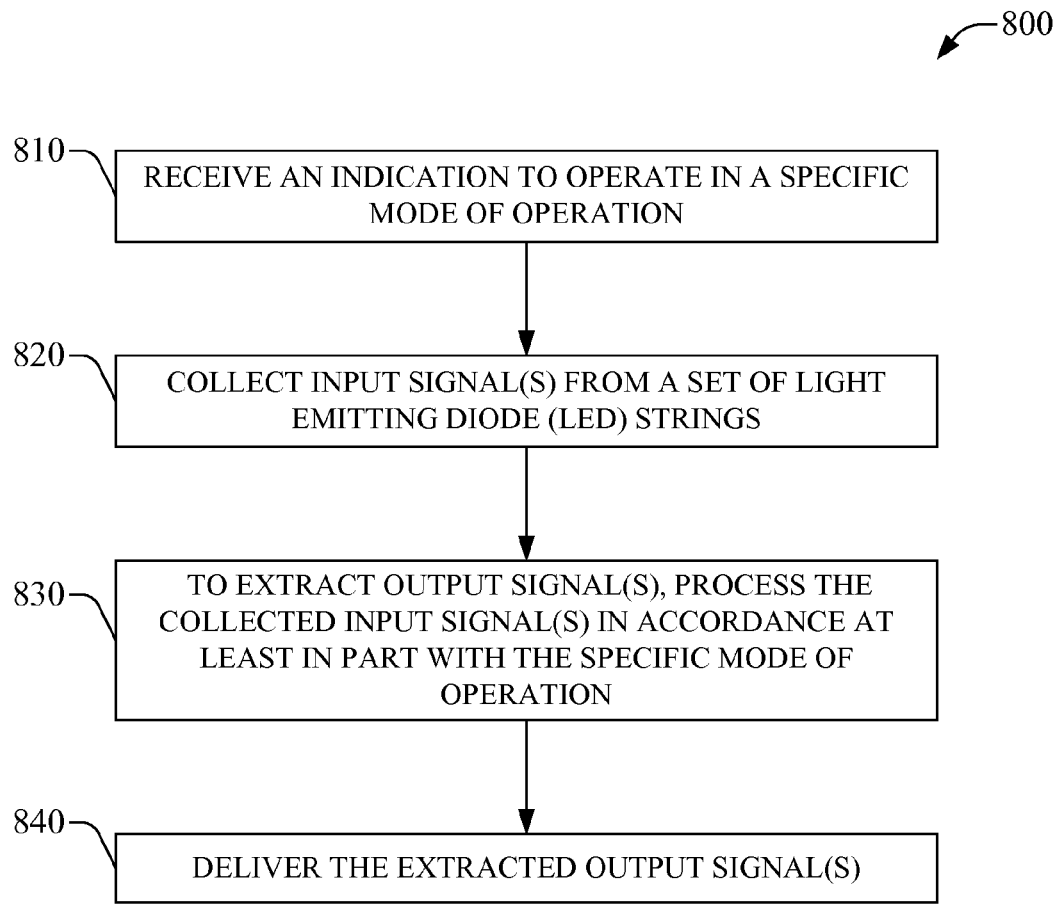
FIG. 8 presents a flowchart of an example method for efficiently monitoring a set of LED strings in accordance with features described herein.

FIG. 8 is flowchart of an example method 800 for efficiently monitoring a set of LED string in accordance with aspects described herein. The subject example method can be performed by an intelligent multiplexer, e.g., 130, or one or more components or devices therein, with functionality as described in the subject specification. In addition or in the alternative, processor(s), e.g., 512, that provide at least a portion of the functionality of the intelligent multiplexer, or one or more components therein, also can carry out the subject example method 800. At act 810, an indication to operate in a specific mode of operation is received. The specific mode of operation is consistent with the various modes of operation (e.g., 224, 226, 228) supported by the intelligent multiplexer that can implement the subject example method. As described supra, the mode of operation can include at least one of a Channel Multiplexing mode (CMM) or a Function Processing mode (FPM). At act 820, input signal from a set of LED strings (e.g., $110_1$-$110_N$) is collected. As described supra, collection of the signal if enabled by a set of pins (e.g., $124_1$-$124_N$) associated with respective LED strings in the set. In addition, input signal also can be collected through a "fault" line or pin (e.g., 128), which can convey logically an indication of faulty operating status of one or more LED strings in the set.

At act 830, to extract output signal(s), the collected input signal is processed in accordance at least in part with the specific mode of operation, and the extracted output signal(s) are delivered at act 840. The processing at act 830 is particular to the embodiment of the intelligent multiplexer that implements the subject example method, as described supra. In addition, based on the mode of operation and the particular embodiment, output signals can include one or more output (s) which are delivered via respective pins or lines, e.g., $134_1$-$134_M$. As described supra, the number of pins or lines employed to convey output signal(s) can be, and generally is, smaller than the number of LED strings in the set.

Figure 9:
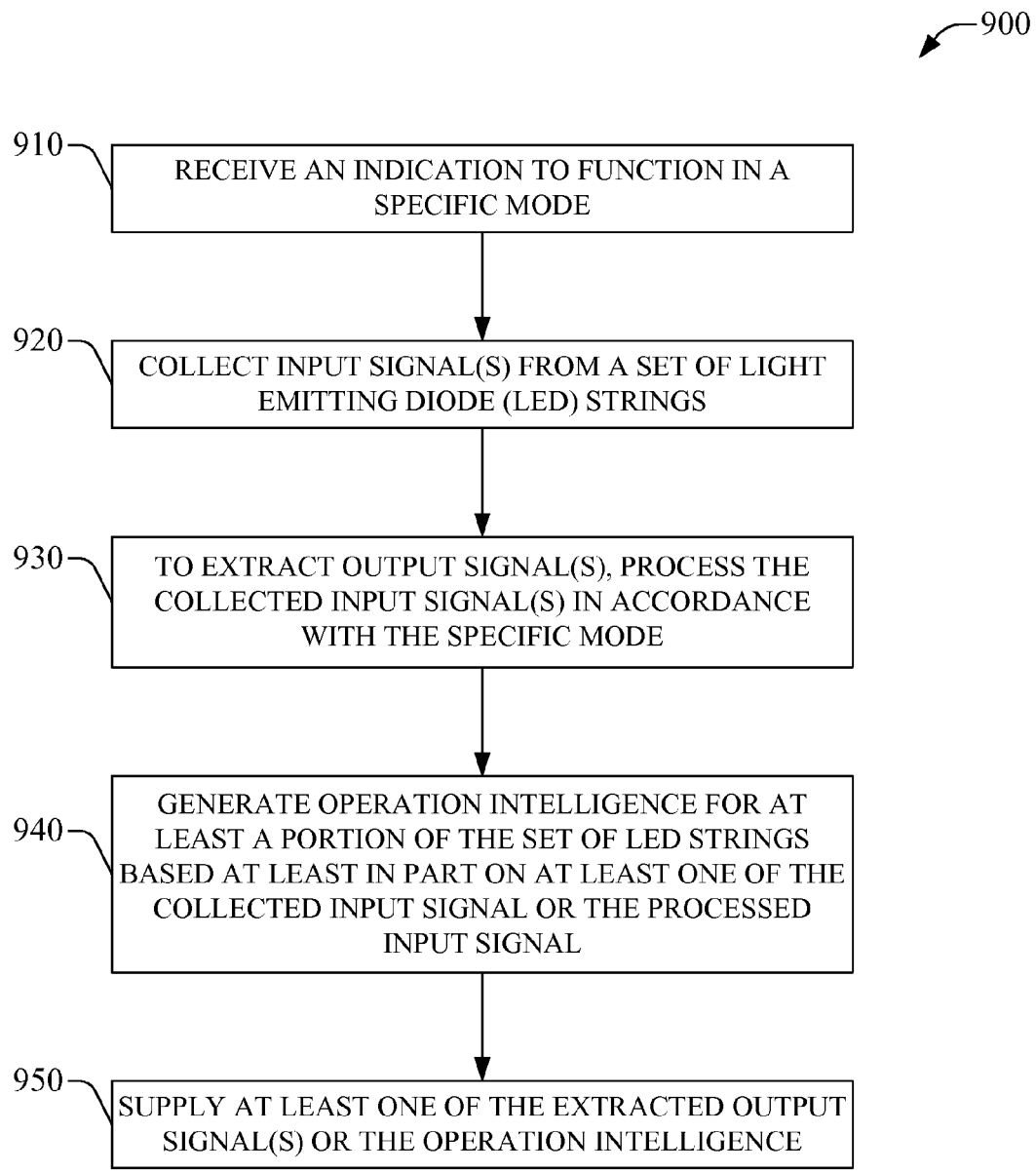
FIG. 9 is a flowchart of an example method for producing, e.g., generating and supplying, operation intelligence for a set of LED strings according to aspects of the subject disclosure.

FIG. 9 is a flowchart of an example method 900 for producing, e.g., generating and supplying, operation intelligence for a set of LED strings in accordance with aspects of the subject disclosure. As with example method 800, the subject example method 900 can be conducted by an intelligent multiplexer (e.g., 130), or one or more components or devices therein, with functionality as described in the subject specification. In addition or in the alternative, processor(s), e.g., 512, that provide at least a portion of the functionality of the intelligent multiplexer, or one or more components therein, also can carry out the subject example method. At act 910, an indication to function is a specific mode is received. The mode refers to operation mode (e.g., 224, 226, 228) of the intelligent multiplexer that can perform the subject example method. At act 920, input signal from a set of LED strings (e.g., $110_1$-$110_N$) is collected. At act 930, to extract output signal(s), the collected input signal is processed in accordance with the specific mode. At act 940, operation intelligence for at least a portion of the set of LED strings is generated based at least in part on at least one of the collected input signal or the processed input signal. Generation of operation intelligence can be effected as described supra. At act 950, at least one of the extracted output signal(s) or the operation intelligence are supplied. In an aspect, either operation intelligence or extracted output signal(s), e.g., F(CH1, CH2 . . . CHN), can be delivered through a set of pins or lines, e.g., $134_1$-$134_M$. In a scenario in which both output signal(s) and operation intelligence is to be delivered, time-division multiplexing (TDM) can be employed for communication of payload data. As described supra, the number of pins or lines employed to convey output signal(s) can be, and generally is, smaller than the number of LED strings in the set.

Figure 10:
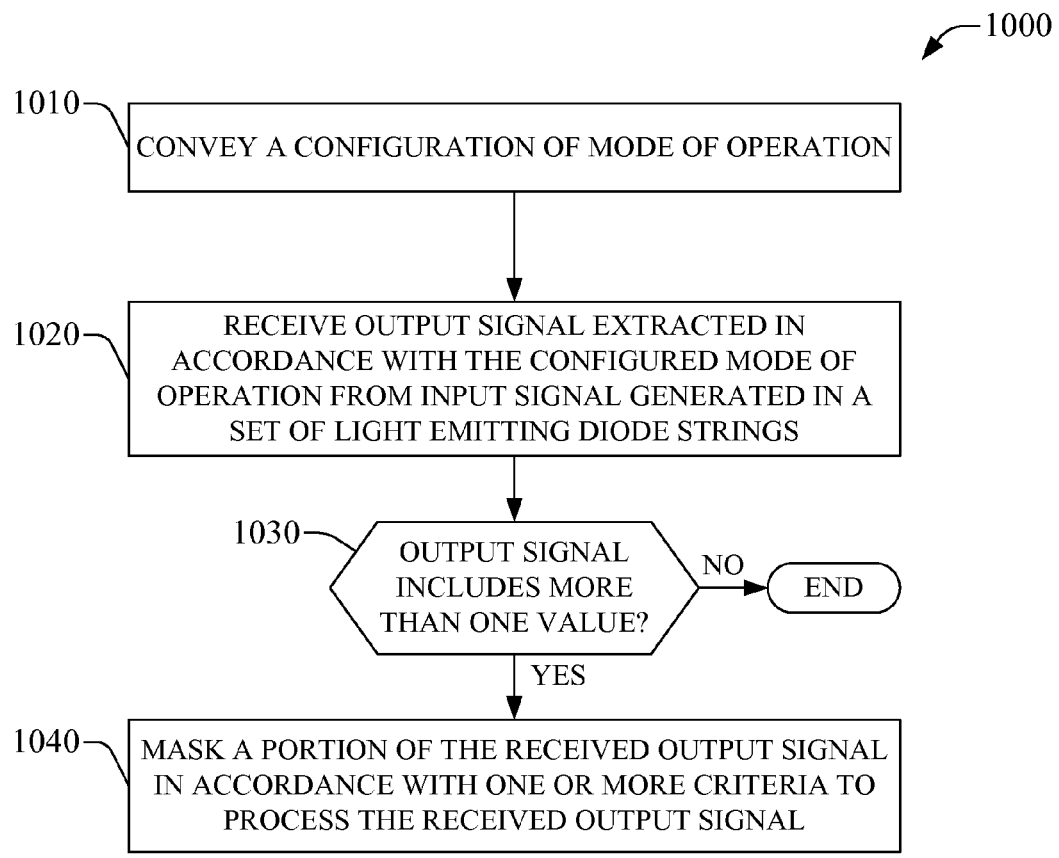
FIG. 10 presents a flowchart of an example method for collecting monitoring operating status of at least one string of LEDs according to aspects described herein.

FIG. 10 presents a flowchart of an example method 1000 for collecting operating status data of at least one string of LEDs according to aspects described herein. The subject example method can be implemented by an intelligent demultiplexer (e.g., 140), or one or more components therein, with functionality as described in the subject specification. In addition or in the alternative, one or more processor(s), e.g., 618 or 660, can implement the subject example method; wherein the one or more processors can provide at least a portion of the functionality of the intelligent demultiplexer, or one or more components therein, or can execute code instruction(s) that implement the intelligent demultiplexer in software or firmware (see, e.g., FIG. 6B). At act 1010, a configuration of mode of operation is conveyed. The configuration can be conveyed to an intelligent multiplexer, and feature(s) of the configuration can serve to set operation of one or more LED strings functionally coupled to the intelligent multiplexer in different operation condition, e.g., phased duty cycle or high duty cycle. As described supra, the mode of operation can include at least one of a channel multiplexing mode (CMM) or a function processing mode (FPM), or a combination of such modes.

At act 1020, output signal extracted in accordance with the configured mode of operation from input signal generated in a set of LED strings is received. The output signal can include one or more values (see, .e.g., FIG. 4), and at act 1030 it is determined if a plurality of values is received in the output signal. In the affirmative case, as described supra, a portion of such output signal is masked, or blanked out, in accordance with one or more criteria to process the output signal at act 1040. Masking can be performed to disregard data that is not employed to process the received output signal; in an aspect, collection component 608 can perform the masking act.

Figure 11:
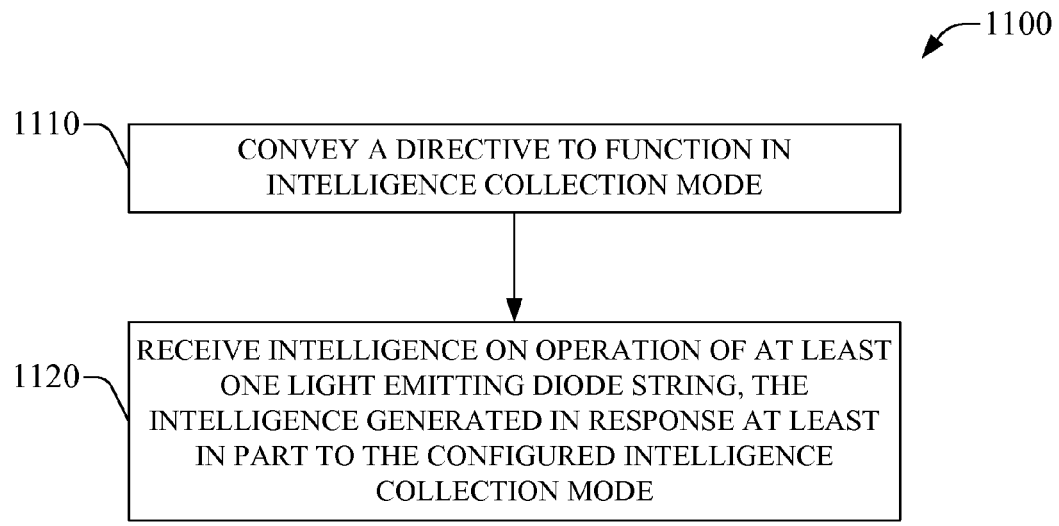
FIG. 11 is a flowchart of an example method for collecting operation intelligence for a set of LED strings in accordance with aspects described herein.

FIG. 11 is a flowchart of an example method 1100 for collecting operation intelligence for a set of LED strings in accordance with aspects described herein. Functional element(s) that perform example method 1000 also can carry out the subject example method. In an aspect, example method can 1100 can configure a service in an intelligent demultiplexer, e.g., 130, that supplies operating intelligence for a set of LED strings; such service can be part of a software or firmware implementation of at least a portion of the functionality of the intelligence demultiplexer. At act 1110, a directive to function in intelligence collection or mining mode is conveyed. At act 1120, intelligence on operation of at least one LED string is received, wherein the intelligence is generated in response at least in part to the configured intelligence collection mode.

Figure 12:
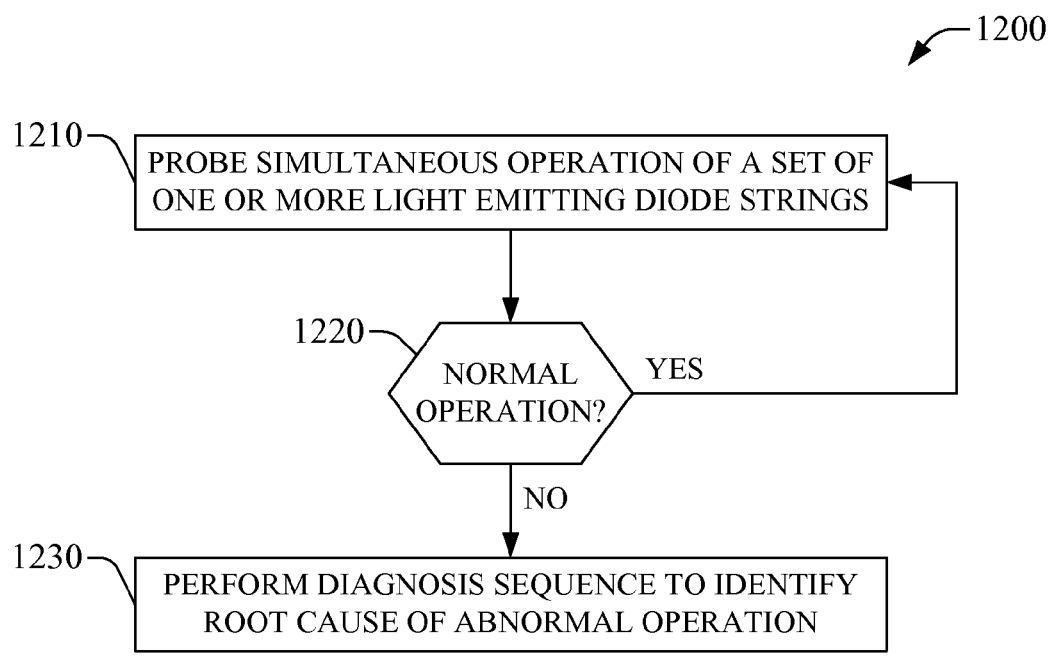
FIG. 12 displays a flowchart of an example method for monitoring operating status of a set of LED strings in accordance with aspects described herein.

FIG. 12 is a flowchart of an example method 1200 for monitoring operating status of a set of LED strings in accordance with aspects described herein. The subject example method can be performed by combination of an intelligent multiplexer and demultiplexer, or one or more processors that provide at least part of the functionality of such components, or component(s) therein. At act 1210, simultaneous operation of a set of one or more light emitting diode strings is probed. At act 1220, it is determined if operation is normal; the determination can be based at least in part on comparison of performance metrics, such as string voltage, with a predetermined range for normal or satisfactory operation. Normal operation leads to further probing of performance. Conversely, if determined operation is not normal, a diagnosis sequence is performed at act 1230 to identify root cause of abnormal operation, e.g., failing LED string(s). In an aspect, the diagnosis sequence can include a phase-shifted PWM detection sequence (see, e.g., FIG. 7B).

Example method 1200 enables a continuous or nearly-continuous screening of satisfactory operating status on top of a more detailed diagnosis sequence. Accordingly, by performing diagnosis when performance is abnormal, the subject example method provides an efficient mechanism to monitor performance in full-duty cycle or high-duty cycle operation in which detection can interrupt cycle performance of a probed set of LED strings and thus adversely affect operation thereof.

As used herein, the term "relative to" means that a value A established relative to a value B signifies that A is a function of the value B. The functional relationship between A and B can be established mathematically or by reference to a theoretical or empirical relationship. As used herein, coupled means directly or indirectly connected in series by wires, traces or other connecting elements. Coupled elements may receive signals from each other.

In the subject specification, terms such as "store," "data store," "data storage," and substantially any term(s) that convey other information storage component(s) relevant to operation and functionality of a functional element or component described herein, refer to "memory components," or entities embodied in a "memory" or components comprising the memory. The memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of further illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. In addition, although elements of the described aspects and/or embodiments may be described or claimed in the singular, the plural is contemplated unless limitation to the singular is explicitly stated. Moreover, all or a portion of any aspect and/or embodiment may be utilized with all or a portion of any other aspect and/or embodiment, unless stated otherwise. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a multiplexer component that collects input signals from one or more light emitting diode (LED) strings via a first set of monitoring pins, and generates one or more output signals based on the input signals in accordance with at least one mode of operation of a plurality of modes of operation, wherein the input signals reveal operating conditions of the one or more LED strings, and wherein a first mode of operation of the plurality of modes of operation extracts a single value of or from the collected input signals using a selective or a sequential process; and
a demultiplexer component that receives the one or more output signals generated by the multiplexer component, the one or more output signals received through a second set of monitoring pins, wherein the number of pins in the second set is smaller than the number of pins in the first set.

2. The system of claim 1, wherein the number of pins in the second set of monitoring pins is unity.

3. The system of claim 1, wherein a second mode of operation in the plurality of modes of operation extracts one or more values by applying predetermined function(s) to the collected input signal.

4. The system of claim 3, wherein the second mode of operation supplies an operating status of the one or more LED strings, wherein the operating status establishes normal or abnormal operation of the one or more LED strings based at least in part on monitoring logic.

5. The system of claim 1, wherein the multiplexer component includes a set of logic gates embodied in a set of discrete devices, wherein the logic gates implement one of Boolean logic or fuzzy logic.

6. The system of claim 1, wherein the multiplexer component autonomously produces operation intelligence for the one or more LED strings based at least in part on historical data related to the collected input signals.

7. The system of claim 1, wherein the demultiplexer component autonomously configures the at least one mode of operation in the plurality of modes of operation for the multiplexer.

8. The system of claim 7, wherein the autonomous configuration is based at least in part on artificial intelligence methodologies and includes generation of satisfactory time(s) at which to receive the one or more output signals generated by the multiplexer component.

9. The system of claim 8, wherein the satisfactory time(s) are synchronized with operation of an apparatus that exploits the one or more LED strings.

10. The system of claim 8, wherein the satisfactory time(s) represent(s) the time(s) for adjusting reception of the one or more output signals generated by the multiplexer component, wherein the satisfactory time(s) correspond(s) to at least one of timing requirements or availability of operation of an apparatus that utilizes the one or more LED strings.

11. The system of claim 1, wherein the demultiplexer component discards at least a portion of the received output signal based at least in part on at least the one mode of operation.

12. A method, comprising:
receiving an indication to operate in a mode of operation of a plurality of modes of operation;
collecting input signal(s) from a set of light emitting diode (LED) string(s), wherein the collecting act is enabled at least in part by a first set of monitoring pins;
extracting one or more output signals by processing the collected input signal(s) in accordance at least in part with the mode of operation, wherein the mode of operation extracts a single value of or from the collected input signal(s) using a selective or a sequential process; and
delivering the one or more output signals through a second set of monitoring pins, wherein the number monitoring pins in the second set is smaller than the number of monitoring pins in the first set.

13. The method of claim 12, wherein, as part of the processing act, the mode of operation produces a single value of the collected input signal(s).

14. The method of claim 12, wherein, as part of the processing act, the mode of operation produces one or more values that are predetermined function(s) of the collected input signal(s).

15. The method of claim 12, further comprising: generating operation intelligence for at least a portion of the set of LED strings based at least in part on at least one of the collected input signal(s) or the processed input signal(s).

16. The method of claim 12, further comprising:
conveying a configuration of the mode of operation;
receiving output signal(s) extracted in accordance with the configuration; and
if the output signal(s) include(s) more than one value, masking a portion of the received output signal(s) in accordance with one or more criteria to process the received output signal(s).

17. The method of claim 16, wherein conveying a configuration of the mode of operation, further comprises:
conveying a directive to function in intelligence collection mode; and
receiving intelligence on operation of at least one LED string in the set of LED strings, the intelligence generated in response at least in part to the configured intelligence collection mode.

18. A system, comprising:
means for receiving an indication to operate in a mode of operation of a plurality of modes of operation;
means for collecting input signal(s) from a set of light emitting diode (LED) strings, wherein the collecting act is enabled at least in part by a first set of monitoring pins;
means for extracting one or more output signals by processing the collected input signal(s) in accordance at least in part with the specific mode of operation, wherein the mode of operation extracts a single value of or from the collected input signal(s) using a selective or a sequential process; and
means for delivering the one or more output signals through a second set of monitoring pins, the number monitoring pins in the second set is smaller than the number of monitoring pins in the first set.

* * * * *

UNITED STATES PATENT AND TRADEMARK OFFICE
CERTIFICATE OF CORRECTION

| | | |
|---|---|---|
| PATENT NO. | : 8,373,364 B2 | Page 1 of 1 |
| APPLICATION NO. | : 12/648610 | |
| DATED | : February 12, 2013 | |
| INVENTOR(S) | : Hendrik Santo et al. | |

It is certified that error appears in the above-identified patent and that said Letters Patent is hereby corrected as shown below:

In the Specification:

Column 7, Line 26 – after "$V_{CH1}{}^{if}$" delete "$V_{CH2}$" and insert -- $V_{CH1}$ --, therefor.

Column 7, Line 63 – delete "in put" and insert -- input --, therefor.

Column 9, Line 30 – after "as" delete "or".

Column 14, Line 58 – before "1100" delete "can".

Column 15, Line 48 – after "erasable" insert -- programmable --.

In the Claims:

Claim 12, Column 18, Line 19 – after "number" insert -- of --.

Claim 18, Column 18, Line 62 – after "number" insert -- of --.

Signed and Sealed this
Ninth Day of April, 2013

Teresa Stanek Rea
*Acting Director of the United States Patent and Trademark Office*